United States Patent [19]

Watatani

[11] 4,361,813
[45] Nov. 30, 1982

[54] FM AUDIO DEMODULATOR WITH DROPOUT NOISE ELIMINATION CIRCUIT

[75] Inventor: Yoshizumi Watatani, Yokohama, Japan

[73] Assignee: Hitachi, Ltd., Tokyo, Japan

[21] Appl. No.: 162,889

[22] Filed: Jun. 25, 1980

[30] Foreign Application Priority Data

Jun. 27, 1979 [JP] Japan .................................. 54-80206

[51] Int. Cl.³ .......................... H03D 3/00; H04N 5/94
[52] U.S. Cl. .................................... 329/132; 179/1 P;
360/30; 455/312
[58] Field of Search ....................... 329/110, 131, 132;
360/30, 38, 64; 179/1 P; 455/312

[56] References Cited
U.S. PATENT DOCUMENTS 3,553,390  1/1971  Krause .................................. 360/64
4,119,812 10/1978  Fox ................................ 179/1 P X
4,198,541  4/1980  Fukushima ......................... 179/1 P

FOREIGN PATENT DOCUMENTS 53-74817  7/1978  Japan .................................. 329/131

Primary Examiner—Siegfried H. Grimm
Attorney, Agent, or Firm—Antonelli, Terry & Wands

[57] ABSTRACT

A previous level holding circuit is connected to an output of an FM demodulator to eliminate dropout disturbance from a reproduced audio signal from a record medium on which an FM-modulated audio signal has been recorded. The previous level holding circuit is controlled by an output of a circuit for detecting dropout in the reproduced signal and comprises a gate circuit operable in response to a dropout detection signal and a capacitor. During the occurrence of dropout, the previous level holding circuit holds and produces the reproduced output level assumed immediately before the dropout to eliminate the noise due to the dropout.

3 Claims, 11 Drawing Figures

FM AUDIO DEMODULATOR WITH DROPOUT NOISE ELIMINATION CIRCUIT

BACKGROUND OF THE INVENTION

The present invention relates to a noise elimination circuit for enabling pulsive noise-free reproduction of an audio signal from a record medium on which the audio signal has been recorded with frequency modulation.

In the past, when the audio signal is reproduced from the record medium on which the audio signal has been recorded with frequency modulation (FM), large amplitude noise is produced by the loss of reproduced signal due to dropout or by the discontinuity of the reproduced audio FM signal which may occur at the time of switching of playback tracks in a helical scan type magnetic tape recording and reproducing apparatus in which the audio signal is recorded in superposition on the video signal. This noise is eliminated by fully attenuating the output signal level of an audio signal amplifier during the dropout period.

FIGS. 1a to 1d show reproduced audio signal waveforms for explaining the operation of a prior art noise elimination circuit, in which FIG. 1a shows a reproduced audio FM signal waveform, FIG. 1b shows an FM-detected audio signal waveform, FIG. 1c shows a dropout detection signal and FIG. 1d shows an audio signal waveform with the noise being eliminated based on the dropout detection signal.

During the dropout period shown in FIG. 1a, large amplitude noise as shown in FIG. 1b is produced in the reproduced audio signal. On the other hand, the dropout detection signal as shown in FIG. 1c is produced by amplitude-detecting the reproduced audio FM signal (1a). Accordingly, by blocking the reproduced audio signal in response to the signal (1c), the noise-free audio signal as shown in FIG. 1d is produced. However, the method of merely cutting off the noise results in the discontinuity in the audio signal level. Accordingly, it can reduce the noise but cannot eliminate the noise to a practically acceptable level.

SUMMARY OF THE INVENTION

It is an object of the present invention to provide a noise elimination circuit suitable for use in an audio signal magnetic recording and reproducing apparatus, which circuit can reduce the noise to a practically acceptable level.

Another object of the present invention is to provide a noise elimination circuit suitable for use in a dual-head helical scan type video tape recorder in which a carrier frequency-modulated with a video signal and another carrier of another frequency frequency-modulated with an audio signal are frequency-division multiplexed for recording and/or reproduction on video tracks.

A feature of the present invention resides in that the audio signal is not cut off during the noise period as is done in the prior art noise elimination technique but the audio signal level immediately before the noise appears is held during the noise period to smoothen the junction of the signals before and after the noise elimination, and subsequently it is deemphasized to attenuate high frequency components to further smoothen the junction.

DESCRIPTION OF THE PREFERRED EMBODIMENT

Figure 2:
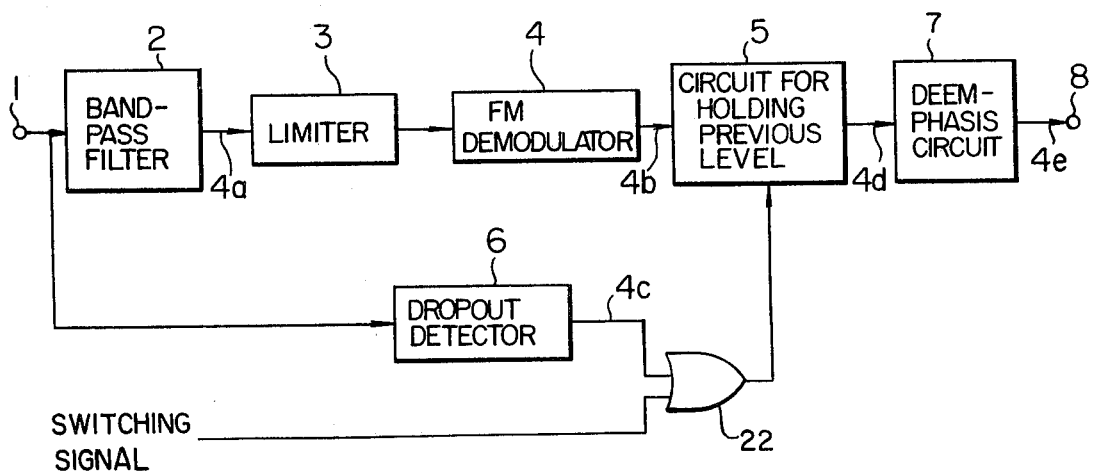
FIG. 2 is a block diagram of one embodiment of a noise elimination circuit in accordance with the present invention.

FIG. 2 shows one embodiment of a noise elimination circuit in accordance with the present invention. Numeral 1 denotes a reproduced signal input terminal, numeral 2 denotes a band-pass filter (BPF), 3 denotes a limiter, 4 denotes an FM demodulator, 5 denotes a previous level holding circuit, 6 denotes a dropout detection circuit, 7 denotes a deemphasis circuit and 8 denotes a reproduced audio signal output terminal.

The band-pass filter 2, the limiter 3 and the FM demodulator 4 may be those known in FM signal processing circuits. The dropout detection circuit 6 may be the one which has been frequently used in a video tape recorder and it may comprise an amplitude detector and a level comparator for detecting when an output level of the amplitude detector falls below a predetermined level.

Figure 3:
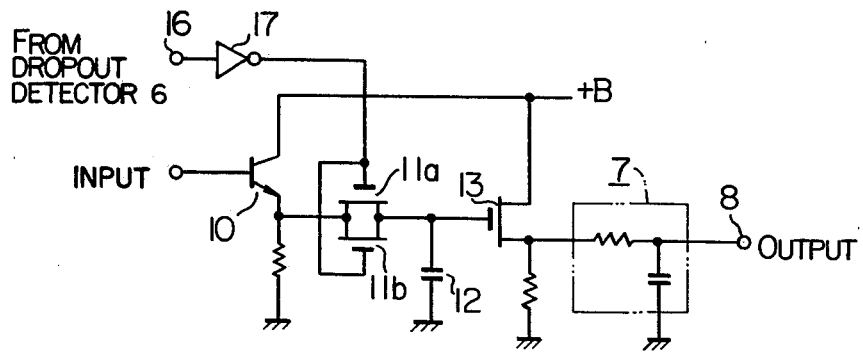
FIG. 3 shows specific examples of a previous level holding circuit and a deemphasis circuit.

FIG. 3 shows specific circuit examples of the previous level holding circuit 5 and the deemphasis circuit 7. A demodulated signal is applied to a gate circuit comprising field-effect transistors 11a and 11b through a transistor 10 of a buffer amplifier. A signal to control the gate is a negative polarity pulse from an inverter 17 which inverts the output of the dropout detection circuit 6, which is applied to a terminal 16. When the dropout is detected and the gate circuit is closed or non-conductive, a charge stored in a capacitor 12 is supplied to the deemphasis circuit 7 through a field effect transistor 13. Meanwhile, when no dropout is detected with the gate circuit opened or being conductive, the demodulated output from the demodulator 4 supplied to the base of the transistor 10 is allowed to pass through the gate circuit to the field-effect transistor 13.

Figure 1A:
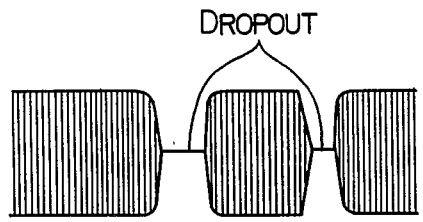
FIGS. 1a to 1d show signal waveforms in a prior art technique.
Figure 1B:
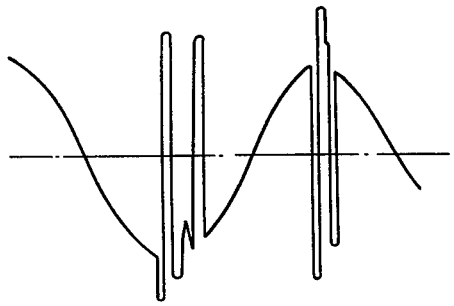
Figure 1C:
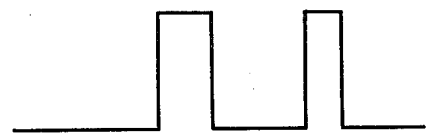
Figure 4A:
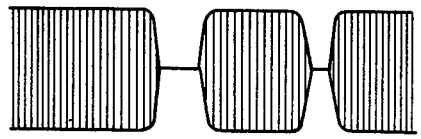
FIGS. 4a to 4e show signal waveforms in the circuit of FIG. 2.
Figure 4B:
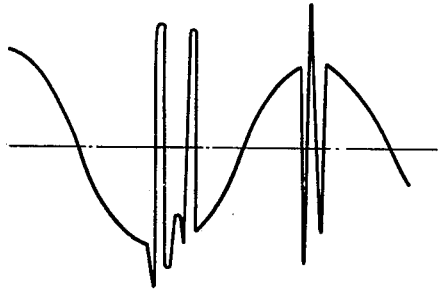
Figure 4C:
Figure 4D:
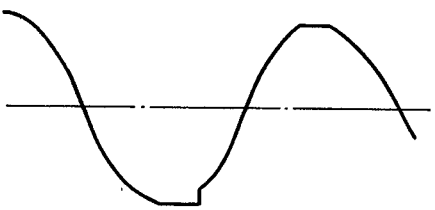
Figure 4E:
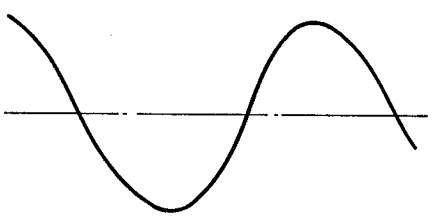

FIGS. 4a to 4e show signal waveforms in the circuit shown in FIG. 2, in which FIG. 4d shows an output audio signal waveform of the previous value holding circuit 5, and FIG. 4e shows an output audio signal waveform of the deemphasis circuit 7. FIGS. 4a, 4b and 4c show similar waveforms to those shown in FIGS. 1a, 1b and 1c. The BPF 2 extracts only the FM-modulated audio signal from the reproduced signal which is applied to the reproduced signal input terminal 1.

As shown in FIG. 4a, the output signal waveform of the BPF 2 has a very small amplitude during the dropout period. When it is amplified by the limiter 3 with a constant amplitude limiting function, the noise components are amplified in the dropout period in which the FM signal is absent. As a result, the demodulated audio signal from the FM demodulator 4 includes large amplitude noise in the dropout period as shown in FIG. 4b.

On the other hand, the dropout period of the reproduced signal can be detected by the dropout detection circuit 6 which senses the amplitude of the reproduced signal. FIG. 4c shows the dropout detection signal thus produced. The previous level holding circuit 5 responds to the output signal from the dropout detection circuit 6 provided via OR gate 22 to hold the output audio signal from the FM demodulator 4, during the dropout period, to a signal level assumed immediately before the dropout.

Figure 1D:
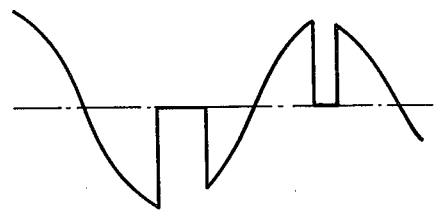

The output audio signal waveform of the previous level holding circuit 5 thus produced is shown in FIG. 4d. It is apparent from the comparison of the waveform shown in FIG. 1d that the audio signal with less noise can be produced. However, because of certain discontinuity in the signal, small noise is still audible. In order to resolve this problem, the signal held in the previous level holding circuit 5 is deemphasized in the deemphasis circuit 7 so that high frequency small noise components and steep discontinuous portion in the signal shown in FIG. 4e are eliminated. Thus, the distortion due to the dropout is no longer audible.

In addition to the noise elimination of the noise due to the dropout, the present invention can also be used to eliminate noise due to the discontinuity of an FM signal which occurs at the time of switching of playback tracks in a helical scan type magnetic tape video recording and reproducing apparatus. That is, it is usual in a video tape recorder of a dual-head helical scan type that two heads are alternately operated to individually record one field of a television signal on parallel tracks. During the reproduction, the two heads are alternately operated to sequentially reproduce the signals on the tracks. Thus, the heads are subjected to alternate switching for each track for electrical connection with a reproducing circuit. When recording and/or reproduction are carried out with such a dual-head helical scan type video tape recorder by superposing an audio FM signal on a video signal, it is possible that a noise occurs at the time of switching between the two heads due to a discontinuity of the carrier for the recorded audio signal. Such noise occurring at the switch-over of the heads, i.e. noise due to a phase step, may not influence the reproduced signal as far as the signal is concerned with a video signal because the head switch-over is usually effected within a vertical blanking time period of a television signal. As for an audio signal, however, since such a cut-off or pause portion is usually not included in an audio signal, noise occurring at the time of the head switch-over is perceived as undesirable noise and brings about a problem. In this case, the timing and the duration of the noise are previously known and a signal for instructing to hold the previous level can be readily produced at the output of OR gate 22 from a playback track switching signal for instructing the switching of playback tracks as seen in FIG. 2. The signal from the previous level holding circuit is then deemphasized like in the embodiment of FIGS. 2 and 3 to eliminate the noise. It should be understood that in the helical scan type magnetic tape video recording and reproducing apparatus a common circuit may be used for the noise elimination for the playback track switching and the noise elimination during the dropout period.

I claim:

1. A noise elimination circuit for an apparatus for reproducing an audio signal from a record medium having a frequency modulated audio signal recorded thereon, comprising:
    an FM demodulator for demodulating the reproduced input signal to produce a reproduced audio signal;
    a previous level holding circuit connected to said FM demodulator for holding, during the duration of a signal indicating the discontinuity of said reproduced input signal, an output thereof to a reproduced audio signal level assumed immediately before the occurrence of said discontinuity, said signal indicating the discontinuity of said reproduced input signal being produced in response to a playback track switching signal; and
    a deemphasis circuit adapted to receive the output of said previous level holding circuit as an input thereto.

2. A circuit for suppressing noise in a reproduced audio signal in a magnetic recording and reproducing apparatus in which a frequency modulated video signal and a frequency modulated audio signal superposed on said video signal are recorded with plural heads on a number of parallel tracks on a magnetic tape, said frequency modulated audio signal resulting from a frequency modulation of a carrier in a frequency band different from that of said frequency modulated video signal with an audio signal, and in which the recorded signals are reproduced with said plural heads, said noise being undesirably produced when switching is made between said heads for said signal reproduction, the noise suppressing circuit comprising:
    a frequency demodulator to which a frequency modulated audio signal, derived from a signal read from said magnetic tape, is supplied and which serves to demodulate said frequency modulated signal to produce a demodulated audio signal;
    means for generating, on the basis of a head switching signal, a pulse signal starting at a head switching time and continuing therefrom for a predetermined time duration;
    a previous level holding circuit to which said demodulated audio signal is supplied, said previous level holding circuit being responsive to said pulse signal from said pulse signal generating means to hold the level of the demodulated audio signal right before noise is produced, for said predetermined time duration including a time period of appearance of the noise; and
    a de-emphasis circuit to which the output of said previous level holding circuit is applied.

3. A circuit according to claim 2, further comprising a dropout detection circuit for detecting a dropout time period on the basis of changes in the reproduction level of said frequency modulated audio signal read from the magnetic tape and for producing a dropout time period representing signal to be supplied, in addition to said pulse signal, to said previous level holding circuit for control of operation of said previous level holding circuit.

* * * * *